United States Patent
Hong et al.

(10) Patent No.: US 9,679,786 B2
(45) Date of Patent: Jun. 13, 2017

(54) PACKAGING MODULE OF POWER CONVERTING CIRCUIT AND METHOD FOR MANUFACTURING THE SAME

(71) Applicant: DELTA ELECTRONICS, INC., Taoyuan (CN)

(72) Inventors: Shouyu Hong, Taoyuan (CN); Kai Lu, Taoyuan (CN); Zhenqing Zhao, Taoyuan (CN)

(73) Assignee: Delta Electronics, Inc., Taoyuan (CN)

(*) Notice: Subject to any disclaimer, the term of this patent is extended or adjusted under 35 U.S.C. 154(b) by 0 days.

(21) Appl. No.: 15/051,852

(22) Filed: Feb. 24, 2016

(65) Prior Publication Data

US 2016/0254218 A1    Sep. 1, 2016

(30) Foreign Application Priority Data

Feb. 26, 2015 (CN) .......................... 2015 1 0088406

(51) Int. Cl.
*H01L 23/28* (2006.01)
*H01L 21/56* (2006.01)
(Continued)

(52) U.S. Cl.
CPC .......... *H01L 21/565* (2013.01); *H01L 21/561* (2013.01); *H01L 23/3121* (2013.01);
(Continued)

(58) Field of Classification Search
CPC ......... H01L 25/165; H01L 2224/24137; H01L 21/52; H01L 21/56; H01L 21/563
(Continued)

(56) References Cited

U.S. PATENT DOCUMENTS 5,434,449 A    7/1995  Himeno et al.
6,424,026 B1 *  7/2002  Mangtani ................ H01L 23/24
                                                       257/675
(Continued)

FOREIGN PATENT DOCUMENTS

JP          6378558 A    4/1988
JP        200031338 A    1/2000
(Continued)

OTHER PUBLICATIONS

The First OA issued on Jan. 25, 2017 by the TW Office.

*Primary Examiner* — S. V. Clark
(74) *Attorney, Agent, or Firm* — Yunling Ren

(57) ABSTRACT

The disclosure discloses a packaging module of a power converting circuit and a method for manufacturing the same. The packaging module of the power converting circuit includes a substrate, a molding layer and a plurality of pins. A power device is assembled at the substrate, a plurality of pins electrically are coupled to the power device, the molding layer covers the surface of the substrate with the power device, and at least a contact surface of the pins configured to electrically connect an external circuit is exposed. The molding layer includes a main hat-body part and a hat-brim part, the main hat-body part and the hat-brim part form a hat-shaped molding layer, and the hat-brim part is used to increase a creepage distance between the contact surfaces of the pins located at the top of the molding layer and the bottom of the substrate.

20 Claims, 17 Drawing Sheets

(51) Int. Cl.
*H01L 23/31* (2006.01)
*H01L 23/00* (2006.01)
*H01L 25/07* (2006.01)
*H01L 23/498* (2006.01)
*H01L 23/373* (2006.01)

(52) U.S. Cl.
CPC .. *H01L 23/49844* (2013.01); *H01L 23/49861* (2013.01); *H01L 24/97* (2013.01); *H01L 25/072* (2013.01); *H01L 23/3735* (2013.01); *H01L 2224/32225* (2013.01); *H01L 2224/32245* (2013.01); *H01L 2224/48091* (2013.01); *H01L 2224/48137* (2013.01); *H01L 2224/48195* (2013.01); *H01L 2224/48227* (2013.01); *H01L 2224/73265* (2013.01); *H01L 2224/97* (2013.01); *H01L 2924/19041* (2013.01); *H01L 2924/19042* (2013.01); *H01L 2924/19043* (2013.01)

(58) Field of Classification Search
USPC ......... 257/691, 704, 787; 438/125, 126, 127
See application file for complete search history.

(56) References Cited

U.S. PATENT DOCUMENTS

| | | | |
|---|---|---|---|
| 2011/0073984 A1* | 3/2011 | Lee | H01L 23/3107 257/467 |
| 2014/0131846 A1* | 5/2014 | Shiramizu | H01L 21/50 257/669 |
| 2014/0167237 A1* | 6/2014 | Yoo | H01L 24/73 257/676 |
| 2016/0133533 A1* | 5/2016 | Lin | H01L 24/83 257/766 |
| 2016/0141224 A1* | 5/2016 | Yoshihara | H01L 21/4842 257/676 |

FOREIGN PATENT DOCUMENTS

| | | |
|---|---|---|
| JP | 200276204 A | 3/2002 |
| TW | 200503209 A | 1/2005 |
| WO | 2015012181 A1 | 1/2015 |

* cited by examiner

PACKAGING MODULE OF POWER CONVERTING CIRCUIT AND METHOD FOR MANUFACTURING THE SAME

CROSS REFERENCE TO RELATED APPLICATIONS

This application claims the priority to and the benefit of Chinese Patent Application No. CN201510088406.4, filed Feb. 26, 2015, and entitled "packaging module of power converting circuit and method for manufacturing the same," which is incorporated herein by reference in its entirety.

TECHNICAL FIELD

The present disclosure relates generally to the technical field of semiconductor package, and particularly to a packaging module of power converting circuit and method for manufacturing the same.

BACKGROUND

In power and electronic fields, power converters are required to have high efficiency, high power density, high reliability and low cost. High efficiency means less energy consumption, less cost and being benefit for energy conservation, emission reduction, and environment protection. High power density means being small and light, which may reduce transportation cost and space requirement as well as reduce material cost, thusly reduce construction cost. High reliability means longer service life and lower maintaining cost.

To meet the development trend of power converting module, modularization of power devices become an important development trend. The power module package is developed to be light, slight, short and small, which is an important development direction, however, it has problems in heat dissipating and insulating distance.

Besides, to a packaging module of the power converting circuit based on a direct bonding copper (DBC) substrate or a metallized ceramic substrate, generally one-hole-one-module structure is adopted during plastic packaging. As a result, the plastic packaging mould has to be changed when the module size is changed accordingly. Since the cost of mould is tens of thousands to hundreds of thousands of US dollars, the production cost of the packaging module of the power converting circuit is very high. In actual operation, to avoid overmuch cost of plastic packaging mould, the universality of mould is usually considered during designing. However, this limits the designing and makes it unable to achieve the optimization design.

SUMMARY

The disclosure provides a packaging module of a power converting circuit with high heat dissipating ability and high electric safety on the bases of light and slight packaging, and a method for manufacturing the same.

The additional beneficial effects may be illustrated partially in the following description, and makes it clear from the description, or obtained from the disclosure.

An aspect of the disclosure discloses a packaging module of a power converting circuit which includes a substrate, a power device assembled at the substrate, a molding layer covering a surface of the substrate with the power device and a plurality of pins electrically coupled to the power device and embedded in the molding layer; wherein at least a contact surface of each of the pins configured to electrically connect an external circuit is exposed; wherein the molding layer includes a main hat-body part and a hat-brim part, the main hat-body part and the hat-brim part form a hat-shaped molding layer, and the hat-brim part is used to increase a creepage distance between the contact surfaces of the pins located at the top of the molding layer and the bottom of the substrate.

Another aspect of the disclosure discloses a method for manufacturing a packaging module of a power converting circuit, and the method comprises: providing a panel substrate on which a plurality of power converting circuits are arranged in array; disposing pins and devices for the power converting circuits on the panel substrate; forming an integrated molding layer on the panel substrate to cover the power converting circuits.

In the packaging module of the power converting circuit of the disclosure, pins are built in the packaging module of the power converting circuit, and a second top surface is disposed to increase the creepage distance between the pin and the lower surface of the substrate, which ensures the electric safety of the packaging module of the power converting circuit during usage. Besides, the packaging size and thickness is reduced, which increases the power density of the packaging module of the power converting circuit effectively. In the method for manufacturing the packaging module of the power converting circuit, a panel plastic packaging method is used to lower the requirement to the plastic packaging mould, the plastic packaging mould does not need to be updated even if the size of the packaging module of the power converting circuit is changed, which increases the universality of the plastic packaging mould and reduces the cost for manufacturing packaging module of the power converting circuit.

The foregoing summary is not intended to summarize each potential embodiment or every aspect of the present disclosure.

Figure 1:
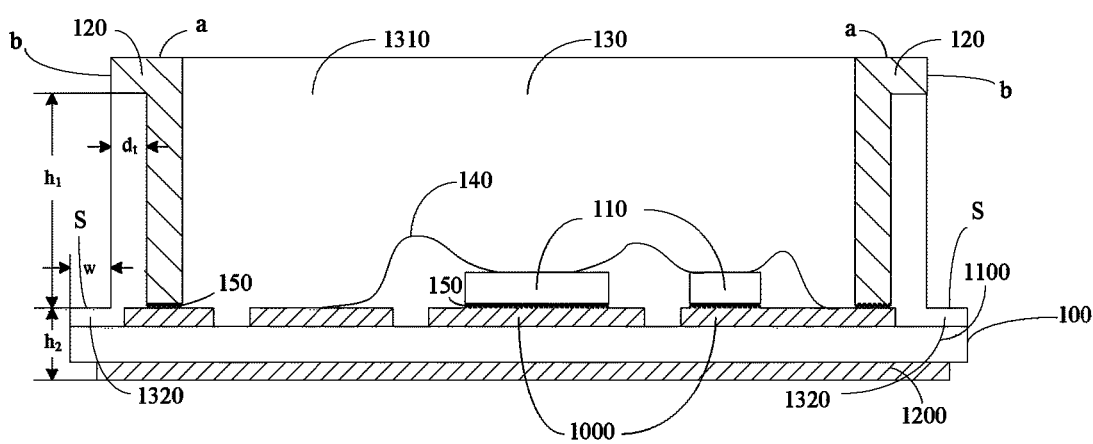
FIG. 1 is a sectional diagram showing the packaging module of the power converting circuit in a first embodiment of the disclosure.

Specific embodiments in this disclosure have been shown by way of example in the foregoing drawings and are hereinafter described in detail. The figures and written description are not intended to limit the scope of the inventive concepts in any manner. Rather, they are provided to illustrate the inventive concepts to a person skilled in the art by reference to particular embodiments.

DETAILED DESCRIPTION

Embodiments will now be described more fully hereinafter with reference to the accompanying drawings. However, the embodiments may be embodied in various forms, and should not be understood as an limitation of the embodiments; rather, these embodiments are provided so that this disclosure will be thorough and complete, and will fully convey the concept of embodiments to those skilled in the art. In the Figures like reference numerals refer to identical or similar structure, and repeated description thereof will be omitted.

The described features, structures may be combined in any suitable manner in one or more embodiments. In the following description, numerous specific details are provided to give sufficient understanding of embodiments of the present invention. However, those skilled in the art will recognize that, without one or more of the specific details, or with other methods, components, materials, etc., the solution of the invention may still be practiced. In other cases, known structures materials, or operations are not shown in detail in order not to obscuring the invention.

FIG. 1 is a sectional diagram showing the packaging module of the power converting circuit in a first embodiment of the disclosure. As shown in FIG. 1, the packaging module 10 of the power converting circuit in the first embodiment includes a substrate 100, at least a power device 110, at least a pin 120 and a molding layer 130.

The substrate 100 is a support plate for assembling at least a power device 110, and includes at least an insulating layer and at least a metal layer. The substrate may be a single/double-sided direct bonding copper (DBC) substrate, a single/double-sided metallized ceramic substrate, an insulating metal substrate (IMS), an organic single/multi-layer printed circuit board (PCB), a high/low-temperature co-fired ceramic (HTCC/LTCC) substrate and so on.

At least a power device 110, such as MOSFET (Metal-Oxide-Semiconductor Field Effect Transistor), IGBT (Insulated Gate Bipolar Translator) or diode, is assembled on the substrate 100 and electrically/physically/thermally coupled to the substrate 100 via bonding material 150 (such as conducting epoxy, brazing filler, sintered material, diffusion soldering material). Electrodes on the power device 110 may be electrically/physically/thermally coupled to the substrate 100 and the pins 120 and so on via wiring bonding by bonding wires 140. In addition, the power device 110 and the substrate 100 may be electrically/physically/thermally coupled via packaging ways such as flip-chip, but the invention is not limited thereto.

The substrate 100 may be, for example, a DBC substrate. As shown in FIG. 1, it includes a first copper layer 1000, a ceramic layer 1100 and a second copper layer 1200. The first copper layer 1000 is formed with circuit patterns, the ceramic layer 1100 is located between the first copper layer 1000 and the second copper layer 1200, and at least a power device 110 is formed on the first copper layer 1000. An external heat sink (not shown) is disposed at the surface of the second copper layer 1200 far away from the ceramic layer 1100. By the structure above, heat generated by the packaging module of the power converting circuit during operation may be transmitted to a side of the substrate 100, and is removed by the external heat sink. Besides, a thermal conductive silicone layer may be disposed between the second copper layer 1200 and the heat sink to conduct heat directly and quickly. In other embodiments, the substrate 100 may also be a printed circuit board (PCB), an insulating metal layer (IMS), a metallized ceramic substrate, an organic circuit board, a high/low-temperature co-fired ceramic (HTCC/LTCC) substrate and so on. The insulating layer and the metal layer may be single layer, double layers or multi-layers, but the invention is not limited thereto. Taking the substrate 100 shown in FIG. 1 as an example, the ceramic layer 1100 is sandwiched between the first copper layer 1000 and the second copper layer 1200, this symmetrical-structured substrate has the advantage of high strength, preferable size stability and so on, but a plurality of distributed stray capacitances with one common terminal electrode (the second copper layer 1200) may be formed between the first copper layer 1000 and the second copper layer 1200, this may harmfully affect the efficiency, voltage stress, control timing sequence and so on of the power converting circuit. To solve these potential problems, the following optimizing plans may be adopted: 1, splitting the second copper layer 1200 by patterns to remove the harmful effect of the capacitances with one common terminal electrode; 2, removing the second copper layer 1200, i.e. a single layer layout substrate is used to remove the stray capacitance.

A molding layer 130 is formed by filling molding compound in the mould (not shown) during manufacturing process to provide physical support and electrical protection to the whole structure. The molding layer 130 is formed on the substrate 100, and covers the substrate 100 on the side with the power device. In the embodiment, the molding layer 130 includes a main hat-body part 1310 and a hat-brim part 1320, the main hat-body part 1310 and the hat-brim part 1320 forms a hat-shaped molding layer. Besides, when the substrate 100 is a DBC substrate, the molding layer 130 further covers the first copper layer 1000 of the substrate 100. In practical application, the packaging module 10 of the power converting circuit is electrically coupled to an external circuit (not shown) via pins 120. To make the heat dissipating surface is different from the electrical-connecting surface between the external circuit and the packaging module 10, the contact surfaces of each pin 120 (that is the surface exposed from the packaging body) is disposed on the main hat-body part 1310 of the molding layer 130. As shown in FIG. 1, the contact surface a of the pin 120 is located on the top of the main hat-body part 1310, thusly the creepage distance between the pin 120 and the lower surface of the substrate 100 (that is the surface of substrate 100 far away from the molding layer 130) makes full use of the thickness of the packaging module of the power converting circuit.

In addition, to simplify packaging process and reduce manufacturing cost (which is illustrated in the following part), the pin 120 is designed to have at least an L-shaped bending portion, and the L-shaped bending portion includes a horizontal portion and a vertical portion, which are relatively positioned. The angle between the horizontal portion and the vertical portion is not limited to 90 degrees. Besides a contact surface a of the horizontal portion exposed from the top of the main hat-body part 1310, the horizontal portion further also includes contact surface b exposed from another side surface of the main hat-body part 1310. The vertical portion of the pin 120 is totally embedded in the molding layer 130.

In FIG. 1, two pins are taken as an example. The two pins 120 are disposed at two opposite sides of the packaging module 10 of the power converting circuit, their contact surfaces b are located at two opposite side surfaces of the main hat-body part 1310, but the invention is not limited thereto. In other embodiments, more than two pins are included, the contact surfaces a and b of the pins are respectively exposed from the top surface and side surfaces of the main hat-body part 1310 of the molding layer.

To further increase the creepage distance, as shown in FIG. 1, the hat-brim part 1320 of the molding layer 130 is included, whose outer surface S is substantially parallel with the upper surface of the substrate 100. In other embodiments, certain angle may also be formed between the outer surface S and the upper surface of the substrate 100. Particularly, taking a rectangle-shaped substrate as an example, the hat-brim part 1320 of the molding layer may be formed on only one edge of the substrate, and may also be formed on two edges, three edges or four edges of the substrate. In other embodiments, the shape of the hat-brim part 1320 may change along with the shape of the substrate, and may also change along with the range of devices on the substrate which needs to be packaged by the molding layer, and the shape is not limited by the embodiments herein.

In some embodiments, it is also possible not to have a hat-brim part 1320 in the molding layer 130, only the main hat-body part 1310 is included in the molding layer 130, the part of the upper surface of the substrate 100 covered by the hat-brim part 1320 in the above embodiments is exposed.

In FIG. 1, under the condition that the insulation penetration distance $d_t$ (which is the distance between the vertical portion of the pin 120 to the edge of the main hat-body part 1310 of the molding layer 130) is satisfied, the creepage distance $d_c$ between the pin 120 and the lower surface of the substrate 100 equals to $h_1+w+h_2$, and $h_1$ is the shortest height from the horizontal portion of the pin 120 to the outer surface S of the hat-brim, $h_2$ is the height from the outer surface S of the hat-brim to the lower surface of the substrate 100, w is the width of the hat-brim. As a result, the creepage distance $d_c$ makes use of the thickness of the packaging module of the power converting circuit and may be adjusted by adjusting the width of the hat-brim, that is, the hat-brim part 1320 of the molding layer 130 is used to increase the creepage distance between the pin and the bottom of the substrate.

Besides, as shown in the embodiment in FIG. 1, the main hat-body part 1310 of the molding layer 130 is solid. The solid main hat-body part 1310 is benefit for protecting the power device and other components on the substrate and effectively isolating the devices on the substrate with the periphery environment.

The insulation penetration distance $d_t$ is usually not less than 0.4 mm. When there is no enhancing insulation requirement between the pin 120 and the lower surface of the substrate 100, the value $d_t$ may be set according to the specified withstand voltage requirement.

As known from the above illustration, in the packaging module 10 of the power converting circuit in the first embodiment of the disclosure, in one aspect, the pins are built in the packaging module of the power converting circuit, the existence of the hat-brim of the packaging module increases the creepage distance between the pin and the lower surface of the substrate, which ensures the electric safety of the packaging module of the power converting circuit during usage. In another aspect, by leading the pin from a side which is far away from the lower surface of the substrate, heat and electric are separated, which is benefit for heat dissipating of the packaging module of the power converting circuit during working. In addition, the pins are designed further to reduce the package size and thickness, and benefit for increasing the power density of the packaging module of the power converting circuit.

Figure 2:
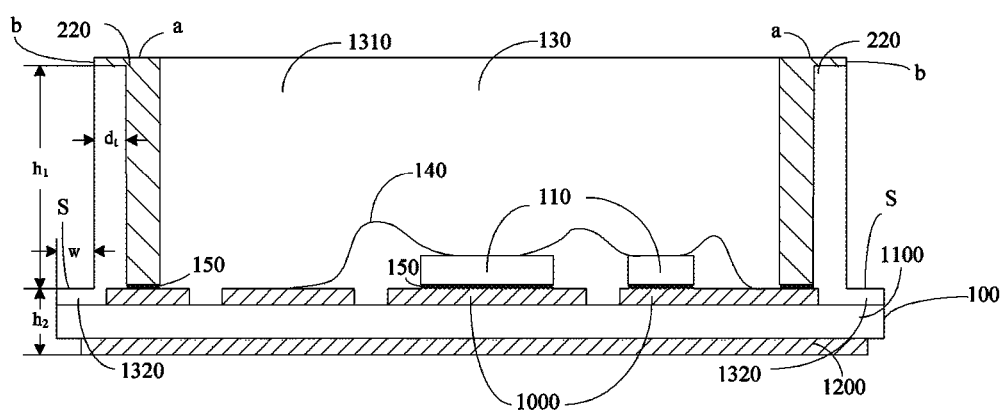
FIG. 2 is a sectional diagram showing the packaging module of the power converting circuit in a second embodiment of the disclosure.

FIG. 2 is a sectional diagram showing the packaging module of the power converting circuit in the second embodiment of the disclosure. As shown in FIG. 2, the pin 220 of the packaging module 20 of the power converting circuit is designed to be different from that in FIG. 1, which is the only difference between the second embodiment and the first embodiment. Compared with the pin 120 in FIG. 1, the width of the horizontal portion of the pin 220 is less than that of the vertical portion of the pin 220, and thusly the height $h_1$ is increased by reducing the horizontal width of the pin 220, thereby increasing the creepage distance $d_c$. From the aspect of manufacturing the packaging module of the power converting circuit, during cutting the pin 220, since the width of the horizontal portion of the pin 220 is reduced, the flexibility of the pin 220 is increased, and the stress generated during plastic packaging on the plastic packaging mould is reduced.

The same parts between the packaging module 20 in the second embodiment and the packaging module 10 of the power converting circuit in the first embodiment are not illustrated herein.

Figure 3:
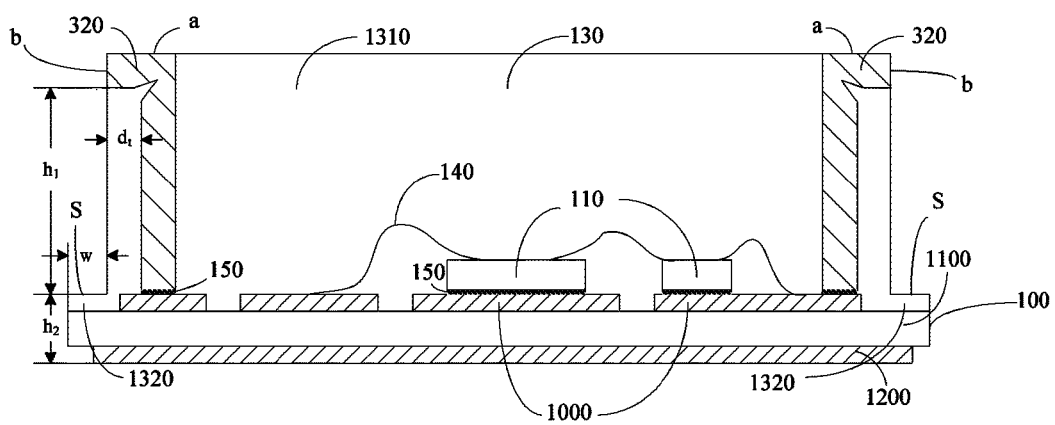
FIG. 3 is a sectional diagram showing the packaging module of the power converting circuit in a third embodiment of the disclosure.

FIG. 3 is a sectional diagram showing the packaging module of the power converting circuit in the third embodiment of the disclosure. As shown in FIG. 3, the pin 320 in the packaging module 30 in the power converting circuit is designed to be different from that of the packaging module 10 of the power converting circuit, which is the only difference between the third embodiment and the first embodiment. Compared with the pin 120 in FIG. 1, a local notch is designed at the crossing portion of the horizontal portion and the vertical portion, thusly the pin is easier to be bent during manufacture, that is, the bending control at the corner of the crossing portion may be more precisely, which makes manufacturing precision is increased. In another aspect, the flexibility of pins may also be increased and the stress generated during plastic packaging on the plastic packaging mould is reduced.

The same parts between the packaging module 30 in the third embodiment and the packaging module 10 of the power converting circuit in the first embodiment are not illustrated herein.

Figure 4:
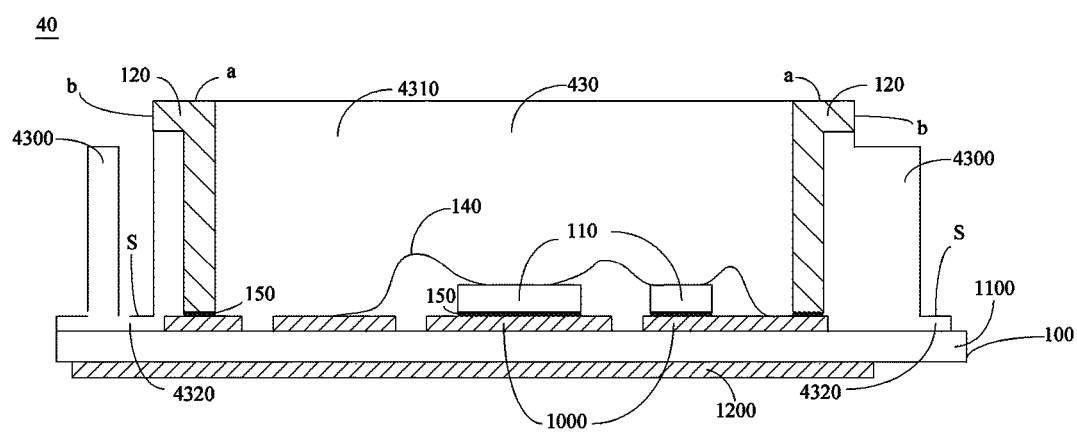
FIG. 4 is a sectional diagram showing the packaging module of the power converting circuit in a fourth embodiment of the disclosure.

FIG. 4 is a sectional diagram showing the packaging module of the power converting circuit in the fourth embodiment of the disclosure. As shown in FIG. 4, the difference between the packaging module 40 of the power converting circuit and the packaging module 10 of the power converting circuit in FIG. 1 lies in, the molding layer 430 further includes at least a creepage protrusion 4300 located at the outer surface S of the hat-brim part 4320 of the molding layer. FIG. 4 shows two types of creepage protrusion structures, the creepage protrusion 4300 at the right side of FIG. 4 is adjacent to the main hat-body part 4310 of the molding layer 430, thusly the width of the creepage protrusion 4300 may further increase the creepage distance between the pin and the lower surface of the substrate (opposite to the surface having the power device thereon). The creepage protrusion 4300 at the left side of FIG. 4 is parallel with the main hat-body part 4310 of the molding layer 430, similarly, under certain conditions, the left protrusion may further increase the creepage distance between the pin and the lower surface of the substrate. However, the two types of creepage protrusions are only examples, which are not used to limit the scope of the disclosure. Any type of creepage protrusions which may increase the creepage distance $d_c$ between the pin 120 and the lower surface of the substrate 100 are in the scope of the disclosure.

Particularly, when the packaging module of the power converting circuit includes a plurality of creepage protrusions 4300, the creepage protrusions 4300 may be the same and may also be different. To take the two pins 120 in FIG. 4 as an example, the two creepage protrusions 4300 may be both the creepage protrusion at the left side of FIG. 4, and may also be both the creepage protrusion at the right side of FIG. 4. Moreover, it is also possible to use two different creepage protrusions as in FIG. 4. In addition, the disclosure may only include one of the creepage protrusions in FIG. 4, which may be the creepage protrusion at the left side or the right side. Besides, a plurality of creepage protrusions may be disposed at one side of the outer surface S of the hat-brim, but the invention is not limited thereto.

The same parts between the packaging module 40 in the fourth embodiment and the packaging module 10 of the power converting circuit in the first embodiment are not illustrated herein.

Figure 5A:
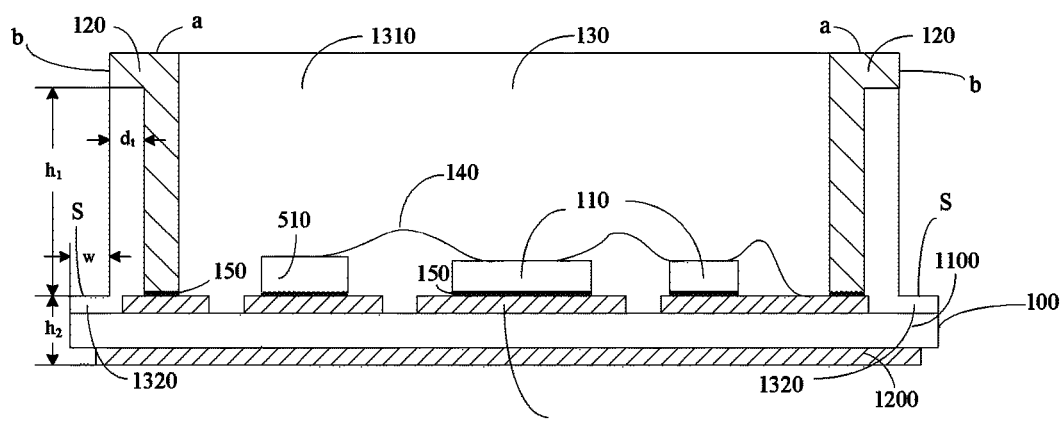
FIG. 5A and FIG. 5B are sectional diagrams showing the packaging module of the power converting circuit in a fifth embodiment of the disclosure.
Figure 5B:
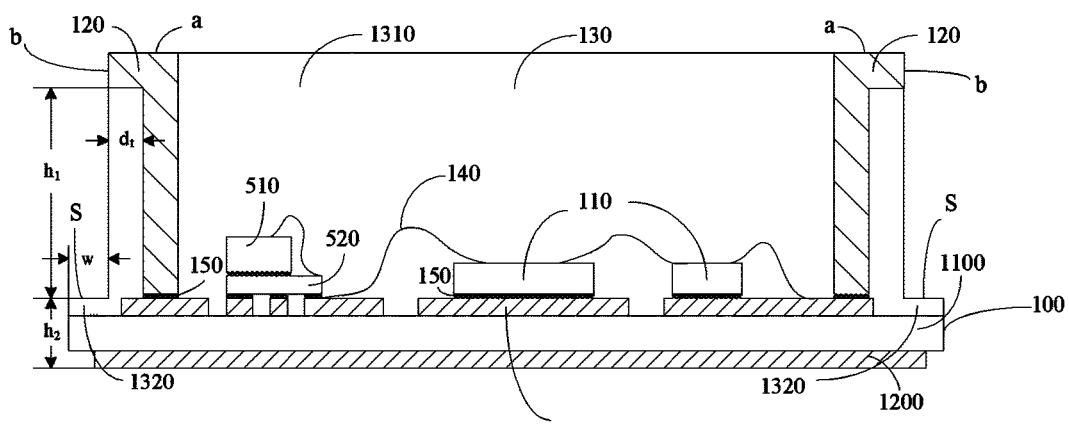

FIG. 5A and FIG. 5B are sectional diagrams showing the packaging module of the power converting circuit. As shown in FIG. 5A and FIG. 5B, the difference between the packaging module 50 of the power converting circuit in the fifth embodiment and the packaging module 10 of the power converting circuit in the first embodiment is, the packaging module 50 of the power converting circuit further includes at least a controlling/driving element 510. The controlling/driving element 510 may be a driving chip, a controlling chip and a periphery circuit element such as a resistor, a capacitor, an inductor, a diode or a transistor which is needed by the driving chip or the controlling chip, but the invention is not limited thereto.

At least a controlling/driving circuit element 510 may be directly electrically coupled to at least a power device 110, and may also be electrically coupled to the substrate 100. The electrical connecting may be by means of bonding wire, flexible printed circuit board or copper sheet, but the invention is not limited thereto.

In FIG. 5A, the controlling/driving circuit element 510 is disposed on the substrate 100, and electrically coupled to at least a power device 110 via wires. Besides, as shown in FIG. 5B, at least a circuit board 520 is disposed, and the circuit board 520 is parallel with the substrate 100 and embedded in the molding layer 130. At least a controlling/driving circuit element 510 is disposed on the circuit board 520, and electrically coupled to the power device 110 via wires.

In addition, it is also possible to dispose at least a power device 110 on the circuit board 520 to make use of the inner space of the packaging module 50 of the power converting circuit.

The same parts between the packaging module 50 in the fifth embodiment and the packaging module 10 of the power converting circuit in the first embodiment are not illustrated herein.

Figure 6:
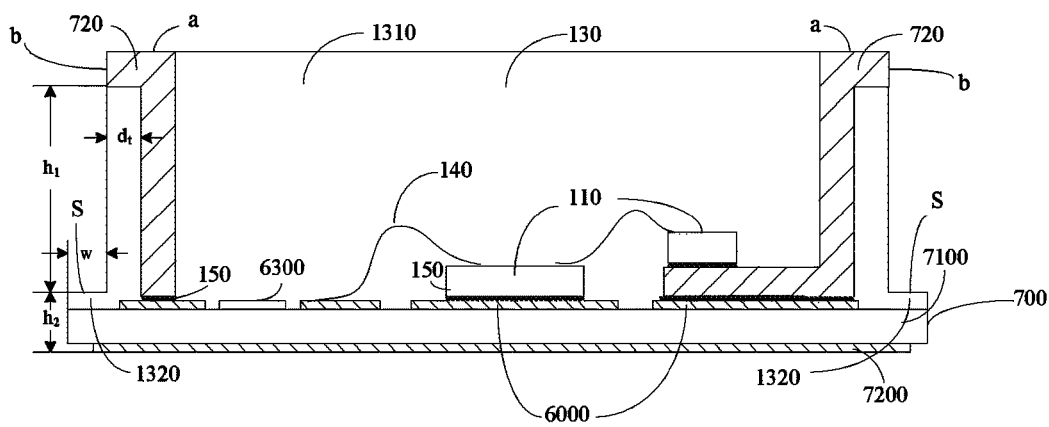
FIG. 6 is a sectional diagram showing the packaging module of the power converting circuit in a sixth embodiment of the disclosure.

FIG. 6 is a sectional diagram showing the packaging module of the power converting circuit in the sixth embodiment of the disclosure. As shown in FIG. 6, the difference between the packaging module 70 of the power converting circuit in the sixth embodiment and the packaging module 10 of the power converting circuit in the first embodiment is, the substrate 700 of the packaging module 70 of the power converting circuit is a metallized ceramic substrate, and one or more power devices 110 of all the power devices 110 are disposed on the pins 720. The metallized ceramic substrate 700 includes a first metallized layer 7000, a ceramic layer 7100 and a second metallized layer 7200.

The metallized ceramic substrate has the advantage of high layout density and high intensity, but the metallized layer on it is relatively thin, where current-carrying ability and heat dissipating ability are limited. As a result, disposing the power devices 110 on the pins 720 may achieve better heat/electric performance. In addition, according to whether the pins 720 need to be electrically coupled to the first metallized layer 7000 of the substrate 700, the pins 720 may be bonded to the first metallized layer 7000 of the substrate 700 via electrical-conductive material, and may also be attached to the metallized area or non-metallized area on the substrate 700 by heat-conducting material which is non-electrical-conductive.

In addition, another way of increasing the current-carrying ability of the metallized ceramic substrate is to increase the thickness of the metallized layer by multi-times printing. When the metallized ceramic substrate is integrated with controlling/driving elements, because the line width of the controlling line on the metallized ceramic substrate is large, and the current-carrying ability requirement is not high, so the metallized layer may be printed only once at the position where the controlling/driving elements are integrated, and the printing thickness may be controlled thinner. Afterwards, if the power devices need to be integrated later, multiple printing times could be added to increase the thickness of the metallized layer.

Another aspect of the disclosure provides a method for manufacturing the packaging module of the power converting circuit, to further reduce the manufacturing cost of the packaging module of the power converting circuit. In an embodiment of the manufacturing method for manufacturing the packaging module of the power converting circuit, a panel substrate is used, power devices and pins are disposed and electrically coupled on the substrate, a process of integral plastic packaging is performed, and then a process of cutting the integral plastic packaging body is performed, and finally a plurality of packaging modules of the power converting circuits are formed.

Figure 7:
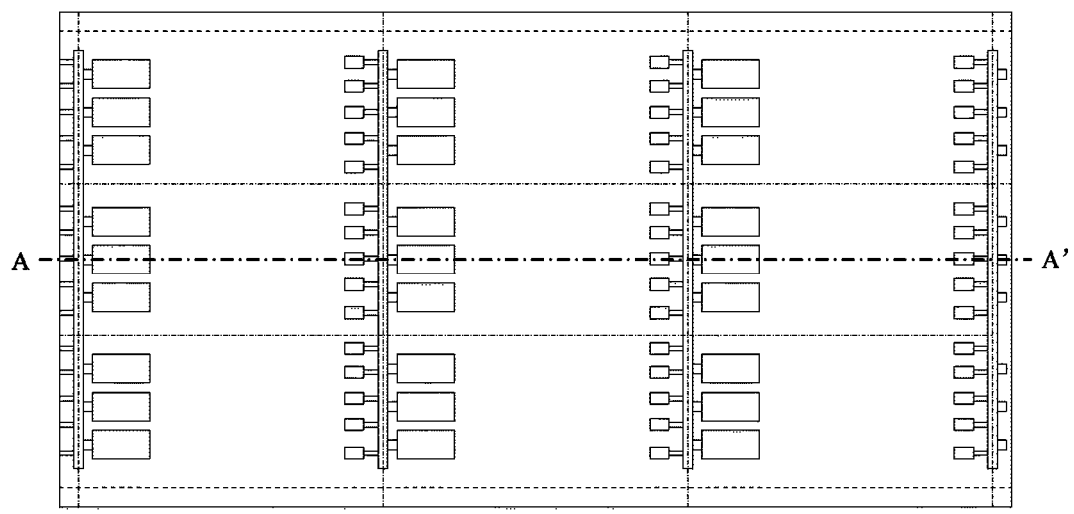
FIG. 7 is a top view diagram showing the plastic packaging body after integrally being packaged in the method for manufacturing the packaging module of the power converting circuit in an embodiment of the disclosure.
Figure 8:
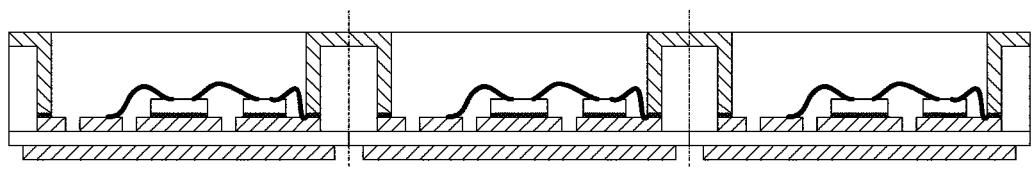
FIG. 8 is a sectional diagram taken along line AA' in FIG. 7.

FIG. 7 is a top view diagram showing the plastic packaging body after the process of integral plastic packaging in the method for manufacturing the packaging module of the power converting circuit in an embodiment of the disclosure. FIG. 8 is a sectional diagram taken along line AA' in FIG. 7. As shown in FIG. 7 and FIG. 8, the integral plastic packaging reduces the requirement to the plastic packaging mould, and the plastic packaging mould may still be used even if the size of the packaging module of the power converting circuit is changed. Thusly, the universality is ensured, and the cost of manufacturing the packaging module of the power converting circuit is reduced.

In FIG. 8, the direct bonding copper substrate is taken as an example. The inner structure of the packaging module of each power converting circuit is substantially the same as that in FIG. 1, and is not illustrated herein.

As known from FIG. 8, the dashed lines represent cutting lines among the packaging modules of the power converting circuits, that is, after cutting along the dashed line, the integral plastic packaging body is cut to be a plurality of packaging modules of power converting circuits. To simplify manufacturing process, the pins of two adjacent packaging modules of the power converting circuits adopt an integral structure, and thusly after cutting the side surface of the packaging module of the power converting circuit may have the contact surface b shown in FIG. 1, but the invention is not limited thereto.

Similarly, in FIG. 8 there are two pins which are disposed at two opposite sides of the packaging module of the power converting circuit respectively, but the invention is not limited thereto. For example, the packaging module may include only one pin, the contact surface is exposed from the top surface and side surface of the main hat-body part of the packaging module of the power converting circuit, or may include two pins, the contact surfaces of which are exposed from the top surface and side surface of the main hat-body part of the packaging module of the power converting circuit.

Figure 9A:
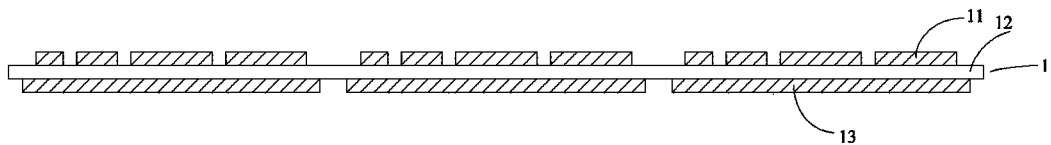
FIG. 9A to FIG. 9E are schematic diagrams showing the method for manufacturing the packaging module of the power converting circuit in an embodiment of the disclosure.
Figure 9B:
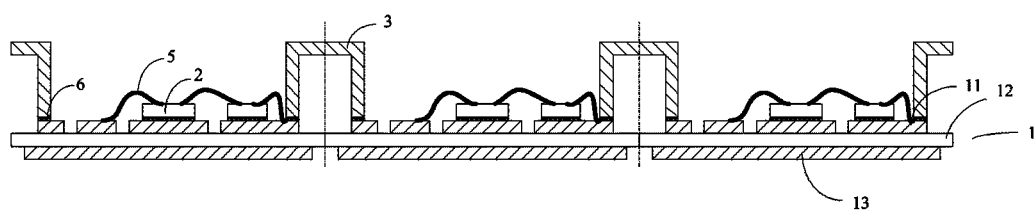
Figure 9C:
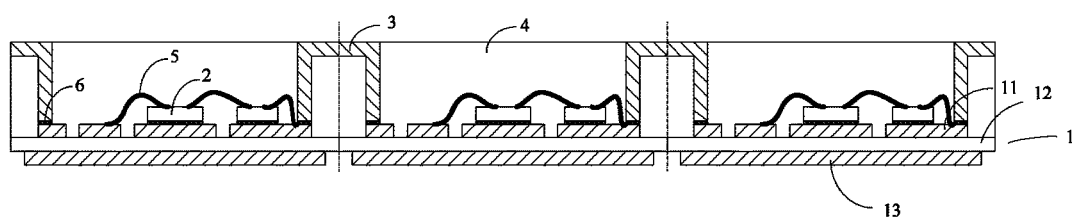
Figure 9D:
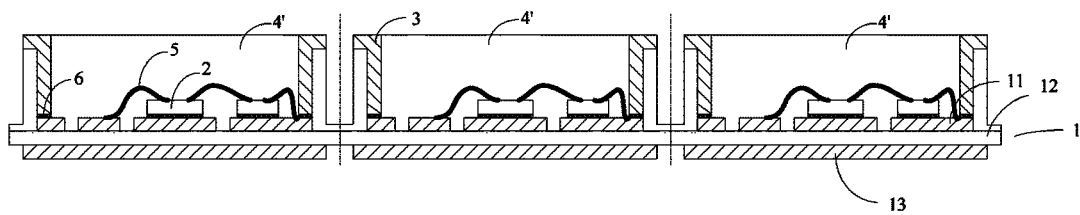
Figure 9E:
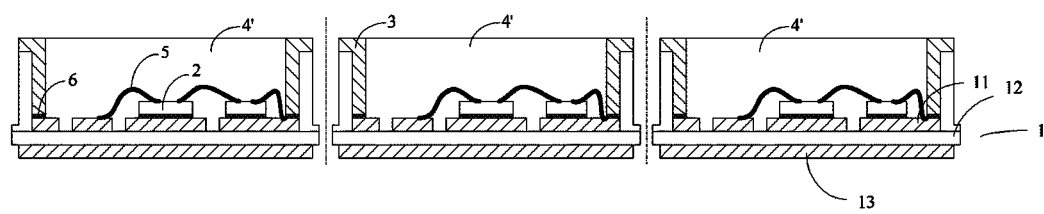

FIG. 9A and FIG. 9E are schematic diagrams showing the method for manufacturing the packaging module of the power converting circuit. The method includes:

Step a, as shown in FIG. 9A, an panel substrate 1 is provided, such as a direct bonding copper substrate, which includes a first copper layer 11, a ceramic layer 12 and a third copper layer 13.

Step b, as shown in FIG. 9B, the power devices 2 and pins 3 are disposed on the substrate 1 and coupled to the substrate by attaching material 6 (such as conducting glue, brazing filler, sintered material, diffusion welding material) or bonding wires 5, to achieve electrically/physically/thermally connection to the substrate 1, but the invention is not limited thereto.

Step c, as shown in FIG. 9C, the substrate 1, the power device 2 and the pins 3 are integrally packaged to form an integrally-formed molding layer 4, covering the substrate 1, the power device 2 and the pins 3. In addition, the contact surface of each pin 3 is exposed from the top surface of the main hat-body part of the molding layer 4. In some embodiments, an injection mould may be used, covered on the panel substrate 1 and integrally casted to form the molding layer 4. A metallized layer is disposed at the position of the panel substrate 1 where the injection mould is covered. Particularly, in practical manufacturing, due to the affection of molding pressure, part of the molding compound may overflow to the upper surfaces of the pins, and then the subsequent processing (such as sand blasting, grinding and so on) may be used to remove the molding compound to obtain a flat surface. In certain scenarios, to make a mould compatible with different module thickness, the thickness of the mould may be defined according to the thickest product in the product series. As to thinner modules, pins with a lower height may be adopted. After plastic packaging, the pins may be exposed by grinding.

Step d, as shown in FIG. 9D, the molding layer 4 and the pins 3 are cut to a predetermined position to form the main hat-body part of the molding layer 4' of each packaging module of the power converting circuit. The width of the cutting opening between the two adjacent main hat-body parts is larger than the width of the cutting opening between the two adjacent hat-brim parts.

The predetermined position may be shown in FIG. 9D, which is far away from the upper surface of the substrate for tens or hundreds of micrometers. The position may be defined according to the thickness of the hat-brim of the molding layer.

In some embodiments, the predetermined position may be the upper surface of the substrate 1.

Step e, as shown in FIG. 9E, the substrate 1 and the molding layer 4' are separated by such as cutting along the dashed line in FIG. 9E, to form a plurality of independent packaging modules of power converting circuits.

As to the direct bonding copper substrate or metallized ceramic substrate, since the ceramic layer in the middle is very hard, it is difficult to cut by blade, which therefore leading to an increment of labor-hour, a consumption of the blades, and an increment of manufacturing cost. As a result, when a hard-material substrate such as direct bonding copper ceramic substrate or metallized ceramic substrate is used, step a and step e in the above manufacturing process may be further optimized.

Figure 10:
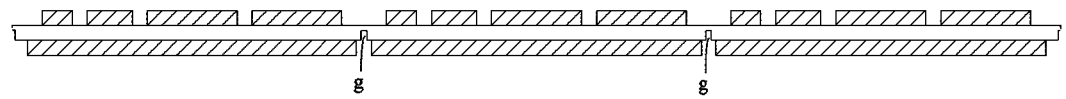
FIG. 10 is a schematic diagram showing the cut marks on the lower surface of the substrate of the integral plastic packaging body in the method for manufacturing the packaging module of the power converting circuit in an embodiment of the disclosure.

Step a', a panel substrate 1 is provided, and as shown in FIG. 10, a cut mark g is formed on the lower surface of the substrate 1 (the surface far away from the plastic packaging) by means of pre-cutting along the dashed line, of which the thickness and width may be tens to hundreds of micrometers. For example, the cutting marks may be formed by laser cutting after the insulating layer is sintered, and may also be formed by laser cutting after the circuit pattern of the substrate 1 is formed. However, in other embodiments, it may also be formed by extruding/cutting during manufacturing green ceramic. The way of forming the cut marks is not limited to the above examples.

Step e', the packaging modules of the power converting circuits are totally separated. For example, by directly bending which is physical bending and breaking, the substrate 1 and the molding layer 4' are separated to form multiple independent packaging modules of power converting circuits.

In some embodiments, after step d, a pre-cutting process is formed at the lower surface of the substrate 1 to form the cut marks, and afterwards a directly bending way is used to separate the substrate 1 and the molding layer 4' to form multiple independent packaging modules of power converting circuits.

In some embodiments, when a dual-sided substrate is used, in consideration of increasing strength of the substrate, the copper at the back of the substrate may be completely preserved. After plastic packaging, the copper layer at the back is patterned, and then the lower surface of the substrate 1 is pre-cut.

Particularly, the above steps are only exemplary illustration, which is not used to limit the procedure of the disclosure. Under practical situation, the step of the disclosure may be changed at any sequence.

Figure 11:
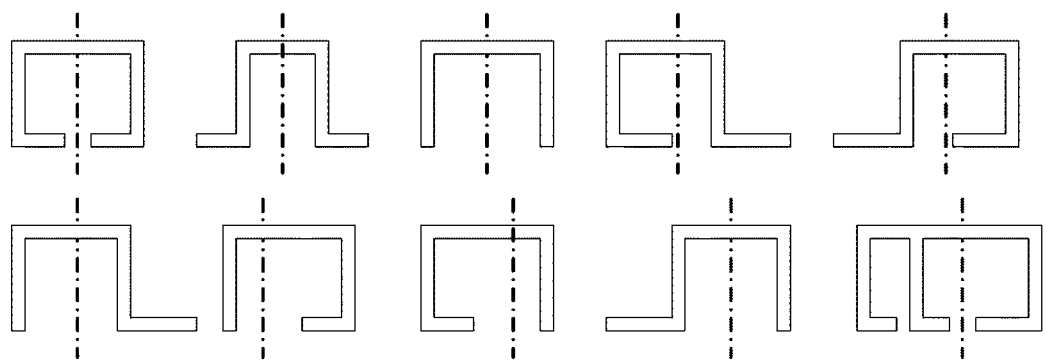
FIG. 11 is a schematic diagram showing the pin structures in the packaging module of the power converting circuit in an embodiment of the disclosure.

In the integral plastic-packaging structure in FIG. 8, a pin structure is disclosed. FIG. 11 further lists several pin structures. As shown in FIG. 11, the pin structures have common points of: having the contact surfaces and the substrate connecting surfaces, wherein the substrate connecting surfaces of the pins are electrically coupled to the substrate, and the contact surfaces thereof are exposed from the top surface and/or side surface of the main hat-body part of the molding layer to further connect an external circuit.

The dashed line corresponds to the cut marks in FIG. 8, is used to separate the independent packaging modules of the power converting circuits. Particularly, all the lines in the pin structures in FIG. 11 are shown as straight line and the edges are vertical to each other. However, in practical process or in consideration of reducing vertical direction rigid of the pins, the lines may also be curve, and the angles are not limited to 90 degrees.

Moreover, the plastic packaging process needs a sealed chamber to ensure the formation of the molding compound. In the method for manufacturing the packaging module of the power converting circuit, a panel substrate is used, and to avoid overflow of glue at the lower surface of the module, a mould chamber larger than the panel substrate may be designed to dispose the panel substrate into the chamber and dispose some stress units into the mould to make the surface of the substrate attached to one surface of the mould better.

Figure 12:
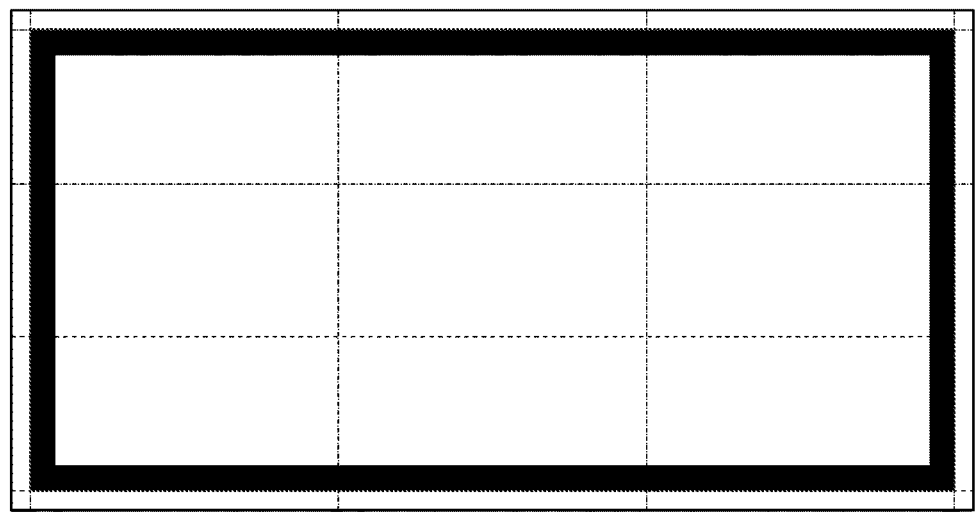
FIG. 12 is a schematic diagram showing the packaging module of the power converting circuit with a metallized layer in the method for manufacturing the packaging module of the power converting circuit in an embodiment of the disclosure.

Under some circumstances, to make the mould compatible with the substrates with different thicknesses, the mould chamber may be designed to be smaller than the mould for the panel substrate. The mould presses periphery of the upper surface of the substrate (the surface with the power devices) to form a sealed chamber, and meanwhile the surface of the substrate and the bottom of the mould are ensured to attach to each other closely to prevent overflow of glue. When a ceramic-based substrate is used, since the material is fragile, the ceramic-based substrate may be broken during mould pressing, so a metallized layer shown in FIG. 12 may be disposed at the position where the mould is covered. The metallized layer may be copper layer to increase the strength of the substrate.

In the method for manufacturing the packaging module of the power converting circuit, a panel substrate and a integrally plastic-packaged way is used, which reduces the requirement to the plastic packaging mould, and the plastic packaging mould may still be used even if the size of the packaging module of the power converting circuit changes, which increases the universality of the plastic packaging mould and reduces the cost for manufacturing packaging module of the power converting circuit.

Apparently, one of ordinary skill in the art can make various changes and modifications to the present disclosure without departing from the spirit and scope of the invention. Thus, the present disclosure intends to encompass such changes and modifications provided that those changes and modifications fall within the scope of claims of the present invention and equivalents thereof.

What is claimed is:

1. A packaging module of a power converting circuit comprising:
   a substrate;
   a power device mounted on a surface of the substrate;
   a molding layer covering the surface of the substrate; and
   a plurality of pins electrically coupled to the power device and embedded in the molding layer, wherein each pin is configured to expose at least a contact surface coupled with an external circuit, one of the at least one contact surface is positioned at the same surface as the top surface of the molding layer;
   wherein the molding layer includes a main hat-body part and a hat-brim part, the main hat-body part and the hat-brim part form a hat-shaped molding layer, the main hat-body part has a shape of block, and the hat-brim part is a protrusion structure protruding from the main hat-body part at a position near the main hat-body part contacted with the substrate, and the hat-brim part is used to increase a creepage distance between the contact surfaces of the pins located at the top of the molding layer and the bottom of the substrate.

2. The packaging module according to claim 1, wherein the substrate comprises at least an insulating layer and at least a metal layer.

3. The packaging module according to claim 2, wherein the substrate comprises a first metal layer and a ceramic layer.

4. The packaging module according to claim 1, wherein the substrate comprises a first metal layer, a ceramic layer and a second metal layer, and the ceramic layer is disposed between the first metal layer and the second metal layer.

5. The packaging module according to claim 3, wherein the first metal layer is coupled to the power device and the pins.

6. The packaging module according to claim 1, wherein the molding layer further comprises a first creepage protrusion, which is disposed at the hat-brim part and is adjacent to or parallel with the main hat-body part.

7. The packaging module according to claim 1, wherein the main hat-body part of the molding layer is solid.

8. The packaging module according to claim 1, wherein each of the pins includes at least a L-shaped metal structure having a vertical portion and a horizontal portion, and the exposed contact surface of each of the pins is located at the horizontal portion.

9. The packaging module according to claim 8, wherein the horizontal portion of the L-shaped metal structure has two surfaces perpendicular to each other, which are exposed to the outside of the main hat-body part of the molding layer.

10. The packaging module according to claim 8, wherein width of the horizontal portion is smaller than width of the vertical portion.

11. The packaging module according to claim 8, wherein a notch is formed at a crossing part of the horizontal portion and the vertical portion of the L-shaped metal structure.

12. The packaging module according to claim 1, wherein height of each of the pins is smaller than or equal to height of the main hat-body part of the molding layer.

13. A method for manufacturing the packaging module of the power converting circuit according to claim 1, comprising:
   providing a panel substrate on which a plurality of power converting circuits are arranged in array;
   disposing pins and devices for the power converting circuits on the panel substrate; and
   forming an integrated molding layer on the panel substrate to cover the power converting circuits.

14. The method according to claim 13, further comprising the step of cutting the panel substrate and the integrated molding layer to separate the power converting circuits and form the packaging module of the power converting circuit.

15. The method according to claim 14, wherein the step of cutting the panel substrate and the integrated molding layer further comprises:
   pre-cutting a back side of the panel substrate to form cut marks at the back side of the substrate;
   cutting the molding layer formed on the other side opposite to the back side of the panel substrate; and
   separating the power converting circuits to form the packaging module of the power converting circuit.

16. The method according to claim 15, wherein separating the power converting circuits is achieved by physical bending for separating.

17. The method according to claim 15, wherein in the step of cutting the molding layer, width of a cutting opening between the two adjacent main hat-body parts is larger than width of a cutting opening between the two adjacent hat-brim parts.

18. The method according to claim 15, wherein pre-cutting a back side of the panel substrate is achieved by laser cutting to form the cut marks.

19. The method according to claim 13, wherein in the step of forming an integrated molding layer on the panel substrate, an injection mould is covered on the panel substrate, and the molding layer is integrally formed by casting.

20. The method according to claim 19, wherein a metallized layer is formed on the panel substrate where the injection mould contacts the panel substrate.

* * * * *